United States Patent
Ohashi et al.

(10) Patent No.: US 7,462,869 B2
(45) Date of Patent: Dec. 9, 2008

(54) SEMICONDUCTOR LIGHT EMITTING DEVICE AND SEMICONDUCTOR LIGHT EMITTING APPARATUS

(75) Inventors: Kenichi Ohashi, Kanagawa-ken (JP); Yasuhiko Akaike, Kanagawa-ken (JP); Hitoshi Sugiyama, Kanagawa-ken (JP); Yasuharu Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/685,375

(22) Filed: Mar. 13, 2007

(65) Prior Publication Data

US 2007/0145385 A1 Jun. 28, 2007

Related U.S. Application Data

(62) Division of application No. 11/102,744, filed on Apr. 11, 2005, now abandoned.

(30) Foreign Application Priority Data

May 17, 2004 (JP) .............................. 2004-146231

(51) Int. Cl.
*H01L 33/00* (2006.01)
(52) U.S. Cl. .............................. 257/79; 257/91; 257/95; 257/744; 257/745; 257/E33.063; 257/E33.065; 257/E33.068
(58) Field of Classification Search ................... 257/79, 257/95, 98–99, 91, 744–745
See application file for complete search history.

(56) References Cited

U.S. PATENT DOCUMENTS 5,116,781 A * 5/1992 Agostinelli et al. ......... 438/559
6,420,732 B1 * 7/2002 Kung et al. .................... 257/79
7,135,709 B1 * 11/2006 Wirth et al. .................... 257/95
2002/0195609 A1 * 12/2002 Yoshitake et al. .............. 257/81
2003/0178626 A1 9/2003 Sugiyama et al.
2003/0197191 A1 10/2003 Nitta et al.
2003/0218172 A1 * 11/2003 Sugawara et al. .............. 257/72
2005/0017250 A1 1/2005 Nitta et al.
2007/0138139 A1 * 6/2007 Asakawa et al. .............. 216/83

FOREIGN PATENT DOCUMENTS

| JP | 7-106631 | 4/1995 |
|---|---|---|
| JP | 9-92878 | 4/1997 |
| JP | 10-200156 | 7/1998 |
| JP | 2003078162 | 3/2003 |
| JP | 2003-188410 | 7/2003 |
| JP | 2003-338637 | 11/2003 |

* cited by examiner

*Primary Examiner*—Ahmed Sefer
(74) *Attorney, Agent, or Firm*—Oblon, Spivak, McClelland, Maier & Neustadt, P.C.

(57) ABSTRACT

A first semiconductor light emitting device includes: a transparent substrate; a light emitting layer; and a roughened region. The transparent substrate has a first major surface and a second major surface, and is translucent to light in a first wavelength band. The light emitting layer is selectively provided in a first portion on the first major surface of the transparent substrate and configured to emit light in the first wavelength band. The roughened region is provided in a second portion different from the first portion on the first major surface. A second semiconductor light emitting device includes: a transparent substrate; a light emitting layer; a first electrode; and at least one groove. The groove is provided on the second major surface of the transparent substrate and extends from a first side face to a second side face opposing the first side face of the transparent substrate.

7 Claims, 17 Drawing Sheets

SEMICONDUCTOR LIGHT EMITTING DEVICE AND SEMICONDUCTOR LIGHT EMITTING APPARATUS

CROSS-REFERENCE TO RELATED APPLICATIONS

This application is a continuation of and claims the benefit of priority under 35 USC §120 from U.S. Ser. No. 11/102,744, filed Apr. 11, 2005 and is based upon and claims the benefit of priority under 35 USC §119 from the Japanese Patent Application No. 2004-146,231, filed on May 17, 2004, the entire contents of which are incorporated herein by reference.

BACKGROUND OF THE INVENTION

This invention relates to a semiconductor light emitting device and a semiconductor light emitting apparatus using a transparent substrate, and more particularly to a semiconductor light emitting device and a semiconductor light emitting apparatus having a structure suitable to achieving sufficient optical output.

Semiconductor light emitting devices, especially light emitting diodes (LEDs), have been widely used for such applications as full-color displays, traffic signal equipment, and in-vehicle applications. These applications particularly require the devices with higher optical output.

Conventionally, typical LEDs of this type have a structure in which a light emitting layer having a p-n junction is formed on the upper surface of a transparent substrate having a generally rectangular cross section and being translucent to the emission wavelength. For the purpose of electrical connection, the light emitting layer is provided with an upper surface electrode on its upper surface side and a lower surface electrode on its lower surface side.

In an LED configured as described above, part of the light emitted from the p-n junction has an incident angle not greater than the critical angle and can be extracted outside the LED. However, light having an incident angle greater than the critical angle is totally reflected, subjected to multiple reflections inside the LED, and finally vanishes by absorption in the light emitting layer or the transparent substrate. This presents a problem that LEDs having a high optical output cannot be obtained. In this respect, an LED having an upper surface on which a roughened light extraction region is formed, and an LED having a lower surface on which a recessed portion of generally spherical shape is formed, are known (see, e.g., Japanese Laid-Open Patent Application 10-200156 (1998), page 3, FIG. 4 (hereinafter referred to as Patent Document 1); or Japanese Laid-Open Patent Application 9-92878 (1997), page 4, FIG. 1 (hereinafter referred to as Patent Document 2)).

The LED disclosed in Patent Document 1 is an LED of the so-called mesa- structure, which has downward curved surfaces in the upper portion of an AlGaAs semiconductor substrate having a p-n junction. The LED comprises a light extraction region made of a rough surface on the upper surface of the p-type semiconductor region, a light reflection region having a collection of numerous microsurfaces on the lower surface of the n-type semiconductor region, and another light extraction region made of a rough surface on the curved surface formed by mesa etching.

The LED disclosed in Patent Document 2 has a light reflection region with a recessed portion of generally spherical shape formed on the lower surface of an AlGaAs semiconductor substrate having a p-n junction by photolithography and etching.

However, the LED disclosed in Patent Document 1 or 2 described above has a problem that, when the LED has a chip size as large as, for example, 0.5 to 1 mm in order to obtain higher optical output, light emitted from the light emitting layer is subjected to multiple reflections inside the LED and absorbed by the light emitting layer many times, which increases the proportion of vanished light and prevents accomplishment of a LED with higher optical output.

SUMMARY OF THE INVENTION

According to an aspect of the invention, there is provided a semiconductor light emitting device comprising: a transparent substrate having a first major surface and a second major surface, and being translucent to light in a first wavelength band; a light emitting layer selectively provided in a first portion on the first major surface of the transparent substrate and configured to emit light in the first wavelength band; and a roughened region provided in a second portion different from the first portion on the first major surface.

According to other aspect of the invention, there is provided a semiconductor light emitting device comprising: a transparent substrate having a first major surface and a second major surface and being translucent to light in a first wavelength band; a light emitting layer provided on the first major surface of the transparent substrate and configured to emit light in the first wavelength band; a first electrode provided on the light emitting layer; a second electrode provided on the second major surface of the transparent substrate; and a first groove provided on the second major surface of the transparent substrate and extending from a first side face to a second side face opposing the first side face of the transparent substrate.

According to other aspect of the invention, there is provided a semiconductor light emitting apparatus comprising: a packaging member having a mounting surface; and a semiconductor light emitting device having: a transparent substrate having a first major surface and a second major surface and being translucent to light in a first wavelength band; a light emitting layer provided on the first major surface of the transparent substrate and configured to emit light in the first wavelength band; a first electrode provided on the light emitting layer; a second electrode provided on the second major surface of the transparent substrate; and a first groove provided on the second major surface of the transparent substrate and extending from a first side face to a second side face opposing the first side face of the transparent substrate, the semiconductor light emitting device being mounted on the mounting surface, with the second major surface facing the mounting surface.

BRIEF DESCRIPTION OF THE DRAWINGS

FIG. 1 shows a semiconductor light emitting device according to a first embodiment of the invention, in particular.

FIG. 2 illustrates the operation of the semiconductor light emitting device according to the first embodiment of the invention, in particular.

FIG. 8 shows a semiconductor light emitting device according to a second embodiment of the invention, in particular.

FIG. 9A is a bottom view thereof, and FIG. 9B is a cross section along line C-C in FIG. 9A;

FIG. 11 shows a semiconductor light emitting device according to a fourth embodiment of the invention, in particular.

FIG. 12 shows a semiconductor light emitting device according to a fifth embodiment of the invention, in particular.

DETAILED DESCRIPTION OF THE INVENTION

Embodiments of the invention will now be described with reference to the drawings.

First Embodiment

Figure 1A:
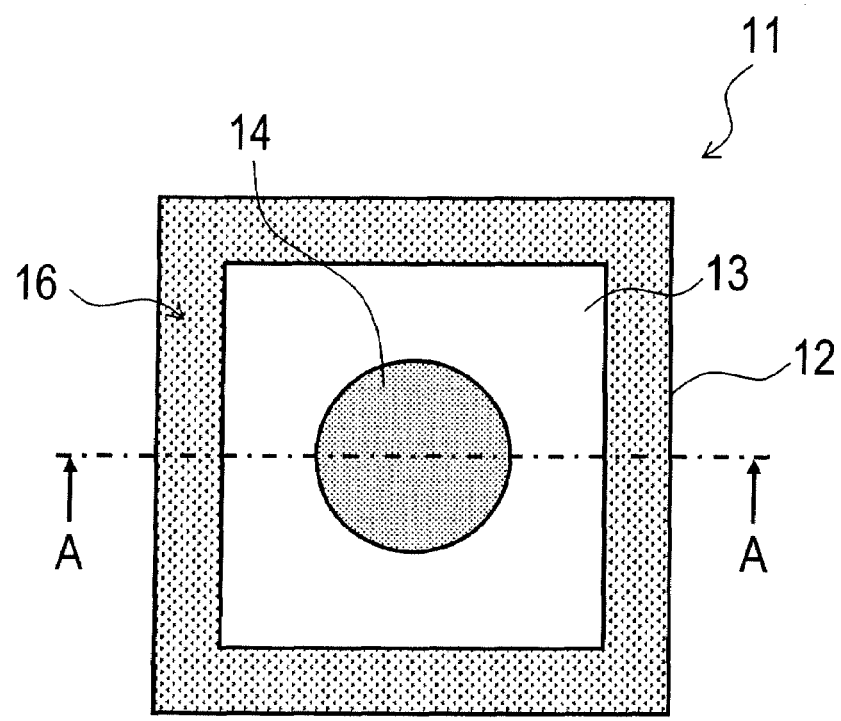
FIG. 1A is a plan view thereof.
Figure 1B:
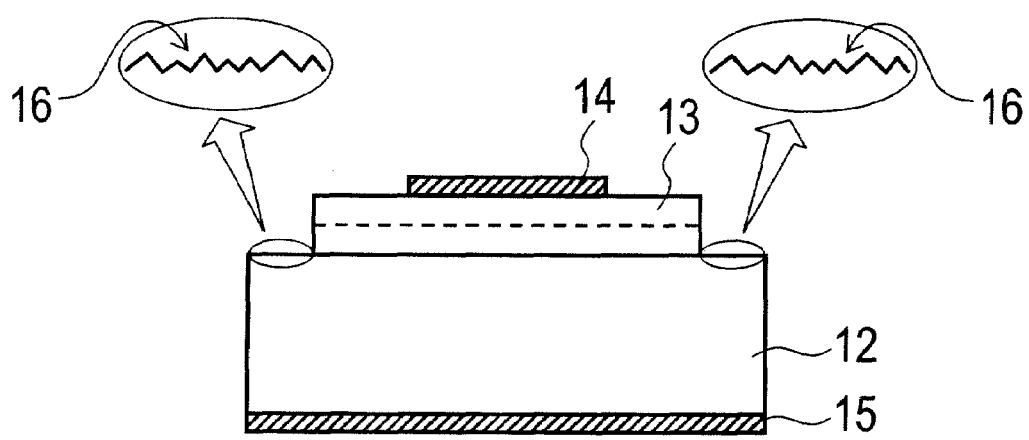
FIG. 1B is a cross section along line A-A in FIG. 1A.

FIG. 1 shows a semiconductor light emitting device according to a first embodiment of the invention. In particular, FIG. 1A is a plan view thereof, and FIG. 1B is a cross section cut along line A-A in FIG. 1A and viewed in the direction of the arrows. This embodiment is an example of a semiconductor light emitting device comprising a light emitting layer of InGaAlP-based material directly bonded to a GaP transparent substrate without the use of adhesives.

As shown in FIG. 1, the semiconductor light emitting device 11 (hereinafter simply referred to as LED) of this embodiment comprises a transparent substrate 12 being translucent to the emission wavelength, a light emitting layer 13 having a p-n junction formed at the center of a first major surface of the transparent substrate 12, a first electrode 14 formed on the surface of the light emitting layer 13, a second electrode 15 formed on a second major surface of the transparent substrate 12 opposite to the first major surface of the transparent substrate 12, and a roughened region 16 formed on the periphery of the first major surface surrounding the light emitting layer 13.

Figure 2A:
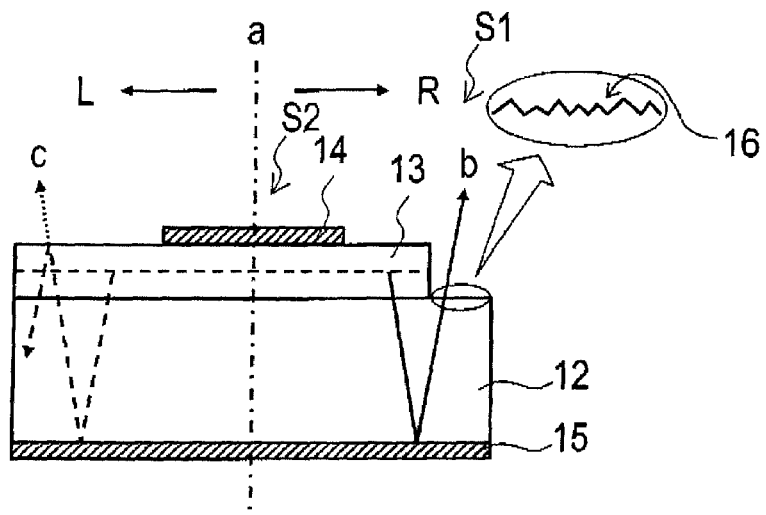
FIG. 2A is a cross section showing an optical path in the LED.
Figure 2B:
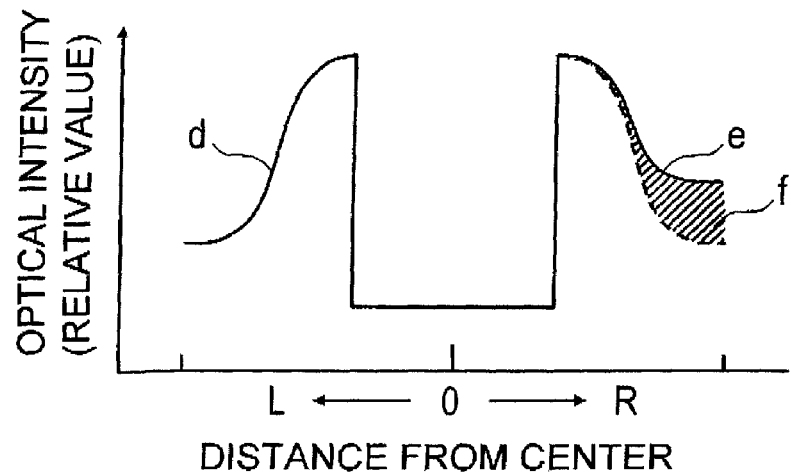
FIG. 2B shows an optical intensity distribution of the LED.

Next, the operation of the LED 11 will be described in detail with reference to the drawings. FIG. 2A schematically shows an optical path of light emitted from the light emitting layer 13, reflected on the second major surface of the transparent substrate 12, and radiated outside from the first major surface side, as compared to the conventional LED. The right side, R, of the center line "a" is a cross section showing the optical path in the LED 11, and the left side, L, is a cross section showing the optical path in the conventional LED. FIG. 2B schematically shows a horizontal optical intensity distribution of the LED 11 as compared to the conventional LED. The right side, R, of the center 0 shows the optical intensity distribution of the LED 11, and the left side, L, shows the optical intensity distribution of the conventional LED.

As shown in FIG. 2A, light "b", emitted from the light emitting layer 13 downward into the transparent substrate 12, reflected on the second major surface of the transparent substrate 12, and reaching the roughened region 16 without passing through the light emitting layer 13, is mostly extracted outside the transparent substrate 12 without being reflected back toward the second major surface side.

On the other hand, in the conventional LED, light "c", emitted from the light emitting layer 13 downward into the transparent substrate 12 and reflected on the second major surface of the transparent substrate 12, passes through the light emitting layer 13. While part of the light is extracted outside the transparent substrate 12, most of the light is reflected on the upper surface of the light emitting layer 13, passes through the light emitting layer 13 again, and experiences multiple reflections.

That is, while the light "b" in the LED 11 experiences a single occurrence of absorption by the light emitting layer, the light "c" in the conventional LED experiences at least three occurrences of absorption.

As shown in FIG. 2B, since current flowing through the light emitting layer 13 is generally attenuated as a function of the distance from the first electrode 14, the optical output is decreased with the distance from the first electrode 14. For this reason, as the chip size becomes larger, the conventional LED is more likely to exhibit an optical intensity distribution "d" having an optical output sharply decreased on the periphery of the transparent substrate 12.

On the other hand, in the LED 11, the light emitting layer 13 is not formed on the periphery of the transparent substrate 12 where otherwise absorption of passing light is greater in proportion than light emission. Therefore the proportion of emitted light absorbed by the light emitting layer 13 can be reduced.

As a result, an optical intensity distribution "e" can be obtained, which has a smaller decrease of optical output on the periphery of the transparent substrate 12. This can enhance the optical output by an amount indicated by the hatched portion "f".

According to experiments, the optical output was enhanced when the ratio of the area, S2, of the light emitting layer 13 to the area, S1, of the transparent substrate 12 is about 0.6 to 0.9. Since the optical output is decreased as the ratio deviates from this range, it is appropriate and preferable that the ratio of the area S2 of the light emitting layer 13 to the area S1 of the transparent substrate 12 be in the range of about 0.6 to 0.9.

This is because, when the ratio of the area S2 of the light emitting layer 13 to the chip area S1 is smaller than 0.6, the amount of light emission itself from the light emitting layer 13 is decreased, which results in insufficient optical output. On the other hand, when the ratio is greater than 0.9, the proportion of light from the light emitting layer 13 absorbed by the light emitting layer 13 is not significantly different from the conventional case.

Advantageously, in order to prevent light reflection, irregularities in the roughened region 16 have an average bottom length of about 0.1 to 3 µm, and an average height equal to or greater than 0.5 times the bottom length. Since the optical output is decreased with deviation from this range, it is appropriate and preferable that the irregularities have an average bottom length of about 0.1 to 3 µm, and an average height of about 0.5 times the bottom length. That is, it is desirable that the average height of irregularities be about 0.05 to 1.5 µm.

This is because a surface of irregularities less than about a fraction of the wavelength of light is substantially identical to a mirror surface, and a surface of irregularities greater than several times the wavelength of light is not favorable to diffuse reflection of light, in view of the fact that light is diffusely reflected on the irregular surface and contributes to enhancing the efficiency of light extraction from the transparent substrate 12.

In addition, it is more preferable that the area of the first electrode 14 be minimized as long as the connecting conductor such as gold wiring can be connected.

In the LED 11 configured as described above, a light emitting layer 13 having a p-n junction is formed at the center of the first major surface of the transparent substrate 12, and the periphery surrounding the light emitting layer 13 is roughened. Therefore a larger proportion of light reflected on the second major surface of the transparent substrate 12 is extracted outside from the roughened region 16 without being absorbed by the light emitting layer 13, which enables to achieve sufficient optical output.

Next, description will be made on an LED comprising a transparent substrate 12 of GaP and a light emitting layer 13 made of InGaAlP-based material, and a specific example of manufacturing a semiconductor light emitting apparatus using this LED.

Figure 3:
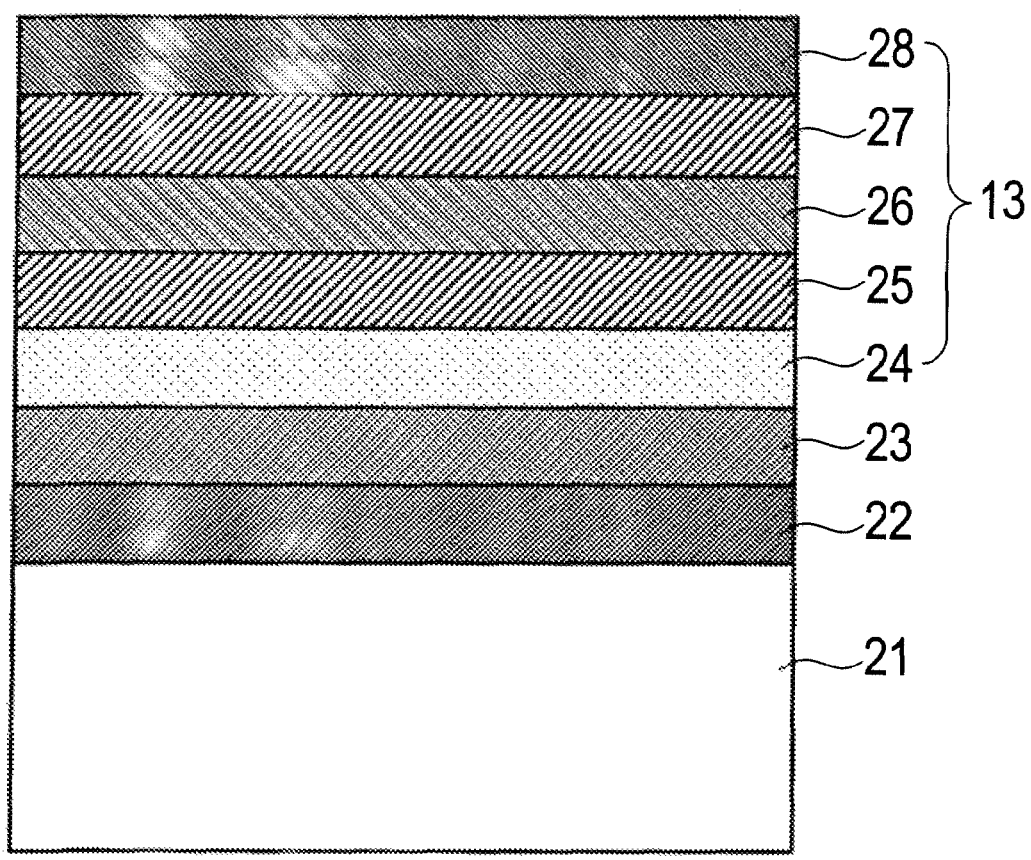
FIG. 3 shows a light emitting layer formed on a GaAs substrate in a process of manufacturing a semiconductor light emitting device according to the first embodiment of the invention.
Figure 4:
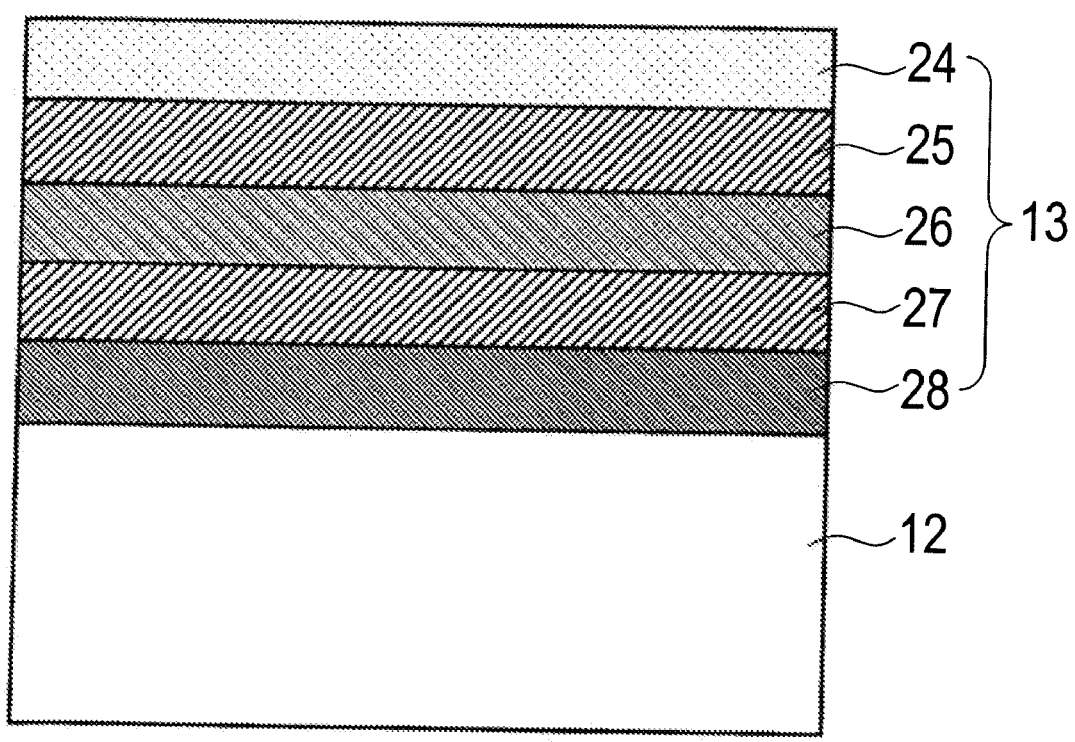
FIG. 4 shows the light emitting layer bonded to a transparent substrate in the process of manufacturing a semiconductor light emitting device according to the first embodiment of the invention.
Figure 5A:
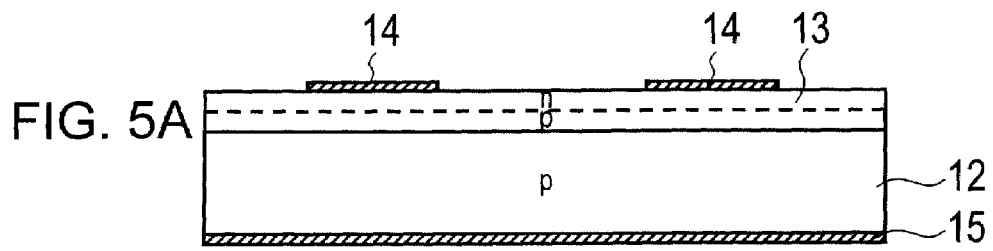
FIGS. 5A through 5D sequentially show a process of forming a rough surface portion in the process of manufacturing a semiconductor light emitting device according to the first embodiment of the invention.
Figure 5B:
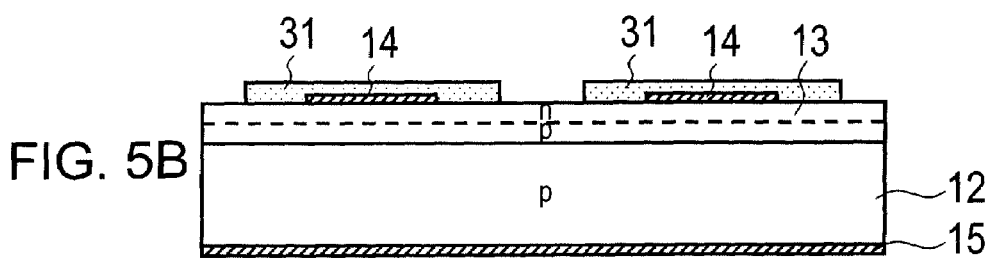
Figure 5C:
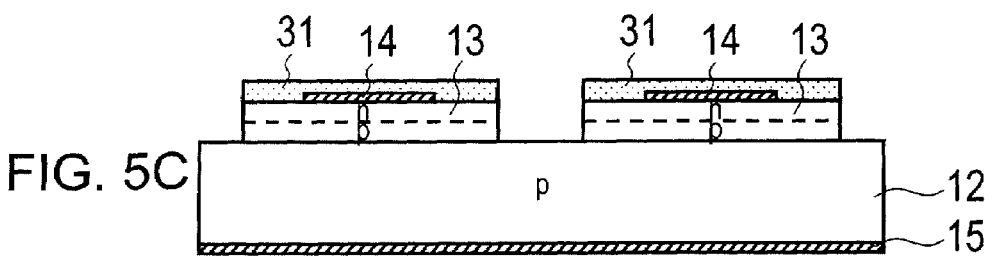
Figure 5D:
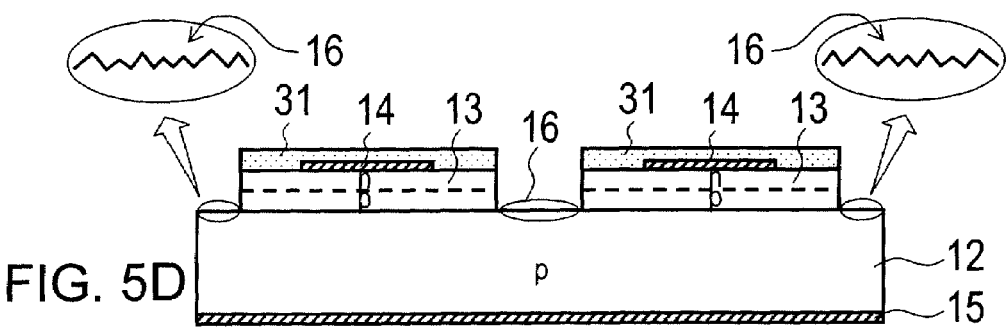
Figure 6A:
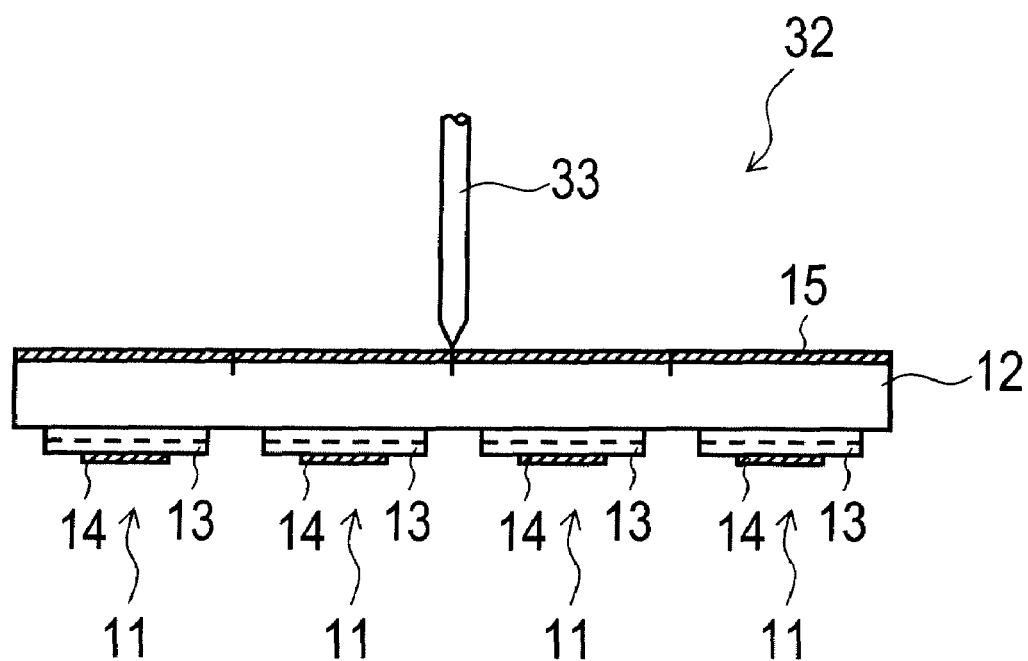
FIGS. 6A and 6B show a process of scribing a wafer in the process of manufacturing a semiconductor light emitting device according to the first embodiment of the invention.
Figure 6B:
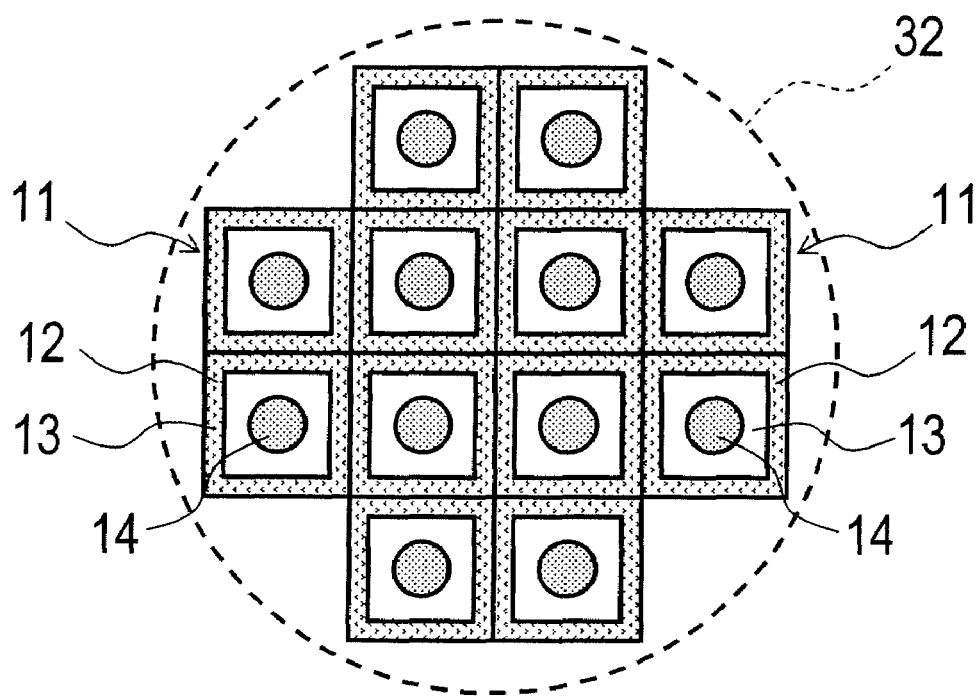

FIGS. 3 to 6 illustrate a process of manufacturing the LED 11. FIG. 3 is a cross section showing a light emitting layer made of InGaAlP-based material formed on a GaAs substrate. FIG. 4 is a cross section showing a light emitting layer made of InGaAlP-based material bonded to a GaP substrate. FIG. 5 sequentially shows a process of forming a roughened region on the LED on which electrodes have been formed. FIG. 6 shows a process of dividing a wafer having LEDs formed thereon into chips.

As shown in FIG. 3, on an n-GaAs substrate 21 having a thickness of 250 µm, an n-GaAs buffer layer 22 having a thickness of 0.5 µm is formed by MOCVD method. Subsequently, an InGaP etching stop layer 23 having a thickness of 0.2 µm, an n-GaAs contact layer 24 having a thickness of 0.1 µm, an n-InAlP cladding layer 25 having a thickness of 1 µm, an InGaAlP MQW active layer 26 having a thickness of 1 µm, a p-InAlP cladding layer 27 having a thickness of 1 µm, and a p-InGaP bonding layer 28 having a thickness of 0.05 µm are sequentially stacked.

Here, the active layer 26 is not limited to the multiple quantum well (MQW) structure, but can also be configured as a single heterostructure (SH), double heterostructure (DH), or quantum well heterostructure (QWH).

Next, as shown in FIG. 4, the p-InGaP bonding layer 28 is brought into intimate contact with the first major surface of the p-GaP transparent substrate 12, and subjected to heat treatment at 800° C., for example.

Next, the GaAs substrate 21 and the GaAs buffer layer 22 are selectively etched away using ammonia-based etchant. Furthermore, the InGaP etching stop layer 23 is selectively etched away by hydrochloric acid.

In this way, the p-InGaP bonding layer 28 is coupled to the p-GaP transparent substrate 12 at an atomic level to obtain an LED comprising a light emitting layer 13 directly bonded to the transparent substrate 12 without the use of translucent adhesives (insulator).

Next, as shown in FIG. 5A, the surface of the light emitting layer 13 is patterned with first electrodes 14 primarily composed of AuGe. A second electrode 15 primarily composed of AuZn is then formed on the second major surface of the p-GaP transparent substrate 12.

Next, as shown in FIG. 5B, a resist film 31 is formed on the light emitting layer 13. Then, as shown in FIG. 5C, the resist film 31 is used as a mask to selectively etch away the light emitting layer 13 by, for example, hydrochloric acid at room temperature for 30 seconds, to expose the first major surface of the p-GaP transparent substrate 12.

Next, as shown in FIG. 5D, the p-GaP transparent substrate 12 is etched by, for example, hydrofluoric acid at room temperature for 20 minutes, to form a roughened region 16 on the periphery of the first major surface of the p-GaP transparent substrate 12 so that the roughened region 16 surrounds the light emitting layer 13, irregularities in the roughened region 16 having an average bottom length of 1 to 3 µm, and an average height substantially equal to the bottom length.

Next, as shown in FIG. 6, the wafer 32 having LEDs formed thereon is divided into chips by using a scriber (not shown) to scribe the transparent substrate 12 from the second electrode 15 side with a diamond pen 33. This results in completion of the LED 11 shown in FIG. 1, in which a light emitting layer 13 is located at the center of the transparent substrate 12 and a roughened region 16 surrounding the light emitting layer 13 is located on the periphery of the transparent substrate 12.

Figure 7:
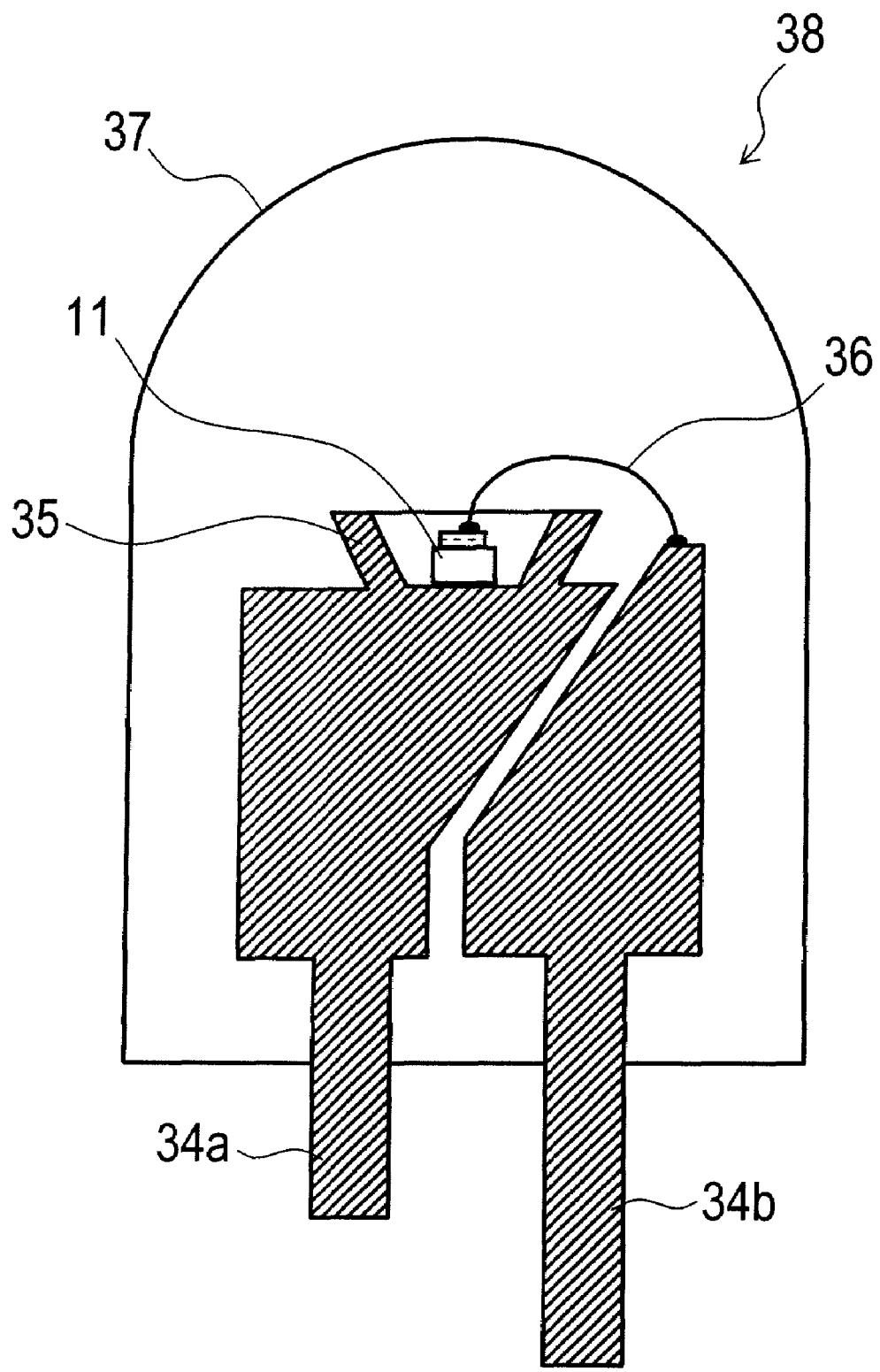
FIG. 7 is a cross section showing a semiconductor light emitting apparatus using a semiconductor light emitting device according to the first embodiment of the invention.

FIG. 7 is a cross section showing a semiconductor light emitting apparatus using the LED 11 shown in FIG. 1. As shown in FIG. 7, the LED 11 is mounted in a reflecting cup 35 formed on a lead frame 34a so that the light emitting layer serves as a light emitting observed surface. The second electrode is fixed to the bottom of the reflecting cup 35 with a conductive adhesive. The first electrode is connected to a lead frame 34b with gold wiring 36.

Finally, a semiconductor light emitting apparatus 38 is obtained by being molded with transparent resin 37. The optical output of this semiconductor light emitting apparatus 38 is enhanced 30% or more as compared to semiconductor light emitting apparatus using a LED of conventional structure.

As described above, according to this embodiment, the proportion of light from the light emitting layer absorbed by the light emitting layer is reduced, which enables to achieve a semiconductor light emitting device having sufficient optical output. Therefore a semiconductor light emitting apparatus having high optical output can be provided.

The foregoing has described a light emitting layer 13 of rectangular shape and a first electrode 14 of circular shape. However, both the light emitting layer 13 and the first electrode 14 may be of rectangular shape, or of circular shape. If the light emitting layer 13 is similar to the first electrode 14, the distance from the first electrode 14 to the edge of the light emitting layer 13 remains generally constant. This provides an advantage of equalizing the in-plane distribution of optical output of the LED 11.

In addition, the semiconductor light emitting apparatus of the invention is not limited to those using a lead frame, but includes various types such as a surface mounting device (SMD) type in which a semiconductor light emitting device is mounted on a packaging board, and a stem type in which a semiconductor light emitting device is mounted on a stem.

Second Embodiment

Figure 8A:
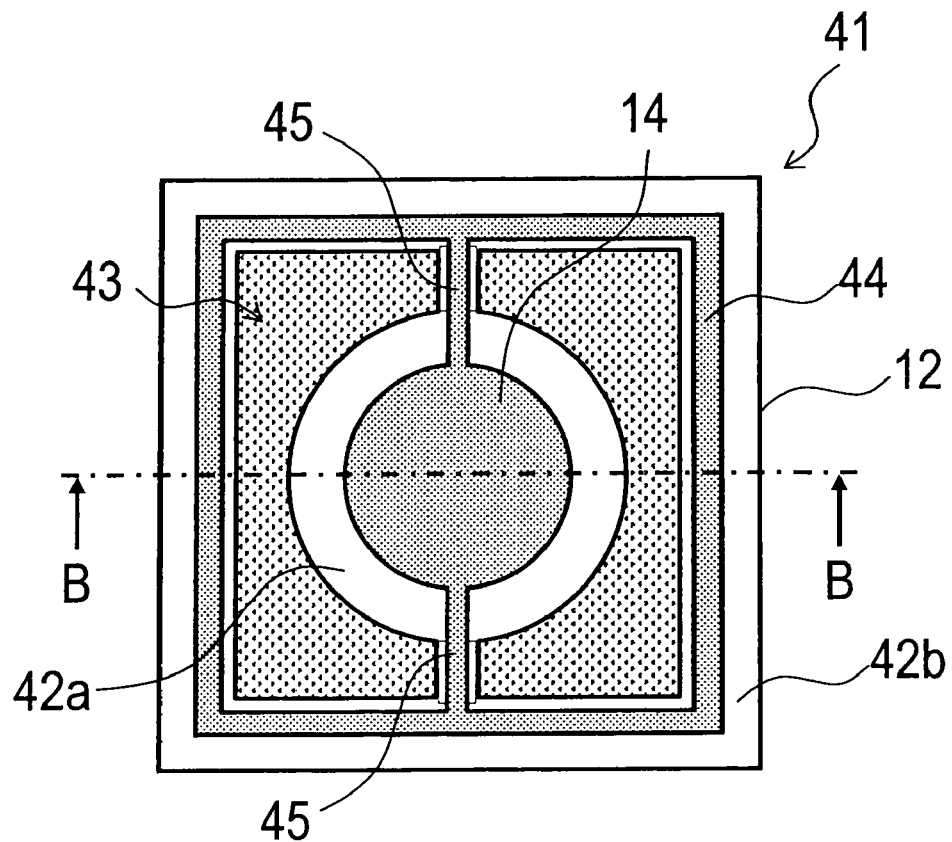
FIG. 8A is a plan view thereof.
Figure 8B:
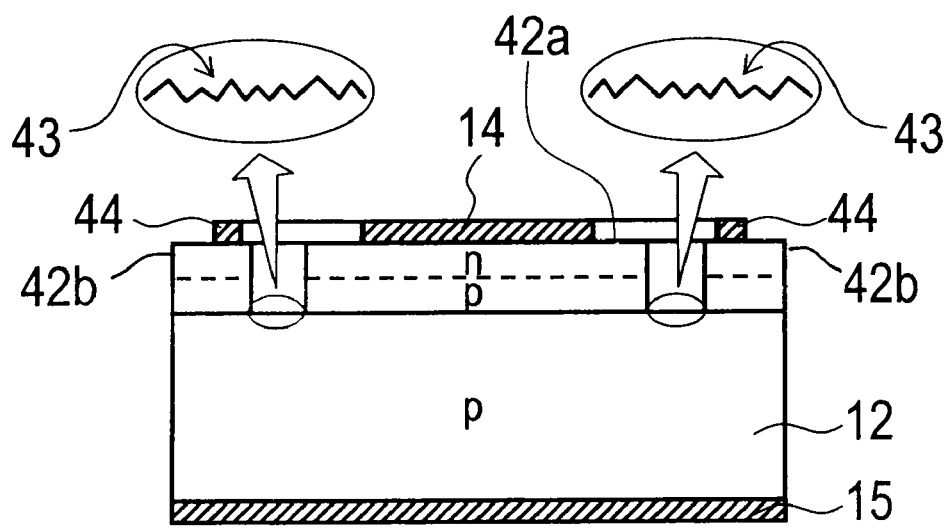
FIG. 8B is a cross section along line B-B in FIG. 8A.

FIG. 8 shows a semiconductor light emitting device according to a second embodiment of the invention. In particular, FIG. 8A is a plan view thereof, and FIG. 8B is a cross section cut along line B-B in FIG. 8A and viewed in the direction of the arrows. In this embodiment, like components as in the first embodiment are marked with like reference numerals and will not be described further.

The second embodiment is different from the first embodiment in that a light emitting layer is formed on each of the center and periphery of the first major surface of the transparent substrate and that a roughened region is formed between the light emitting layers of the center and the periphery.

More specifically, as shown in FIG. 8, the LED 41 of this embodiment comprises a circular light emitting layer 42a formed at the center of a first major surface of the transparent substrate 12, a rectangular light emitting layer 42b formed at the periphery, and a roughened region 43 formed between the light emitting layers 42a and 42b surrounding the light emitting layer 42a.

A circular first electrode 14 is formed on the light emitting layer 42a. A rectangular first electrode 44 is formed on the light emitting layer 42b. The first electrode 14 is electrically connected to the first electrode 44 via wiring 45.

The roughened region 43 is made by, for example, treating the surface of the GaP transparent substrate 12 with inductive coupled plasma (ICP) in an $Ar/Cl_2$ gas atmosphere, followed by immersion into hydrochloric acid. Protrusions of rectangular pyramid shape are formed in the roughened region 43, where the irregularities have an average bottom length of 0.5 to 2 µm and an average height substantially equal to the bottom length.

In the LED 41 configured as described above, a region between the light emitting layers 42a and 42b formed at the center and the periphery, respectively, of the first major surface of the transparent substrate 12 is roughened so that the region surrounds the light emitting layer 42a. Therefore a larger proportion of light reflected on the second major surface of the transparent substrate 12 is extracted outside from the roughened region 43 without being absorbed by the light emitting layers 42a and 42b, which enables to achieve sufficient optical output.

As described above, according to this embodiment, the periphery is also provided with a light emitting layer 42b, which provides an advantage that the in-plane distribution of optical output of the LED 41 can be further equalized.

Third Embodiment

Figure 9A:
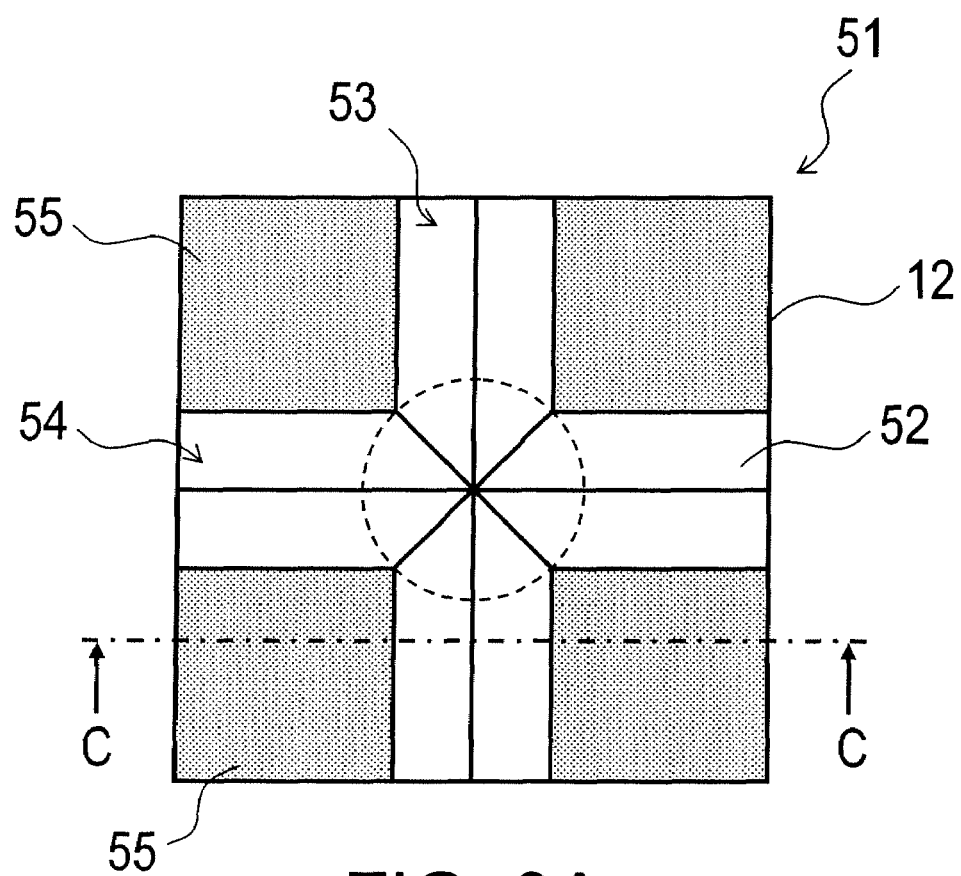
FIGS. 9A and 9B show a semiconductor light emitting device according to a third embodiment of the invention, in particular.
Figure 9B:
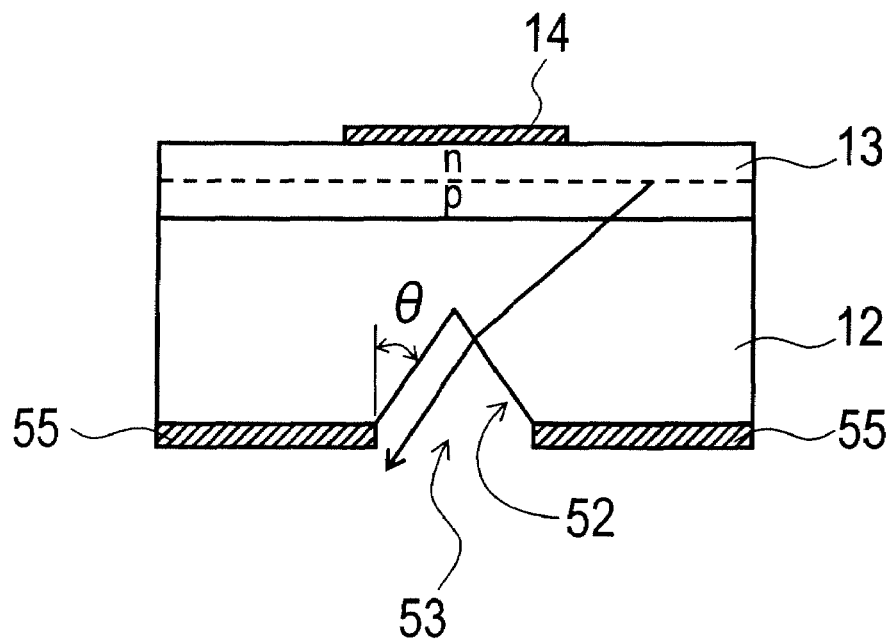

FIGS. 9A and 9B show a semiconductor light emitting device according to a third embodiment of the invention. In particular, FIG. 9A is a bottom view thereof, and FIG. 9B is a cross section cut along line C-C in FIG. 9A and viewed in the direction of the arrows. In this embodiment, like components as in the first embodiment are marked with like reference numerals and will not be described further.

As shown in FIGS. 9A and 9B, the LED 51 of this embodiment comprises grooves 53, 54 extending from one side to the other opposing side of the transparent substrate 12. Each of the grooves 53, 54 has beveled surfaces 52 on the second major surface of the transparent substrate 12 diverging from the first major surface side toward the second major surface side.

The grooves 53 and 54 intersect with each other at a generally right angle at the center of the transparent substrate 12. Second electrodes 55 are formed on the remaining second major surface where the grooves 53, 54 are not formed.

In the LED 51 configured as described above, a larger proportion of light emitted from the light emitting layer 13 toward the second major surface of the transparent substrate 12 can have an incident angle below the critical angle. This results in reducing the proportion of light being subjected to multiple reflections on the second major surface of the transparent substrate 12 and absorbed by the light emitting layer 13. The proportion of light extracted from the beveled surfaces 52 is thus increased.

Therefore the light extracted from the beveled surfaces 52 is repeatedly reflected on the mounting surface of the packaging member such as a reflecting cup (not shown) of a lead frame and on the beveled surfaces 52. Part of the reflected light can be extracted outside from the end portions of the grooves 53, 54.

Figure 9C:
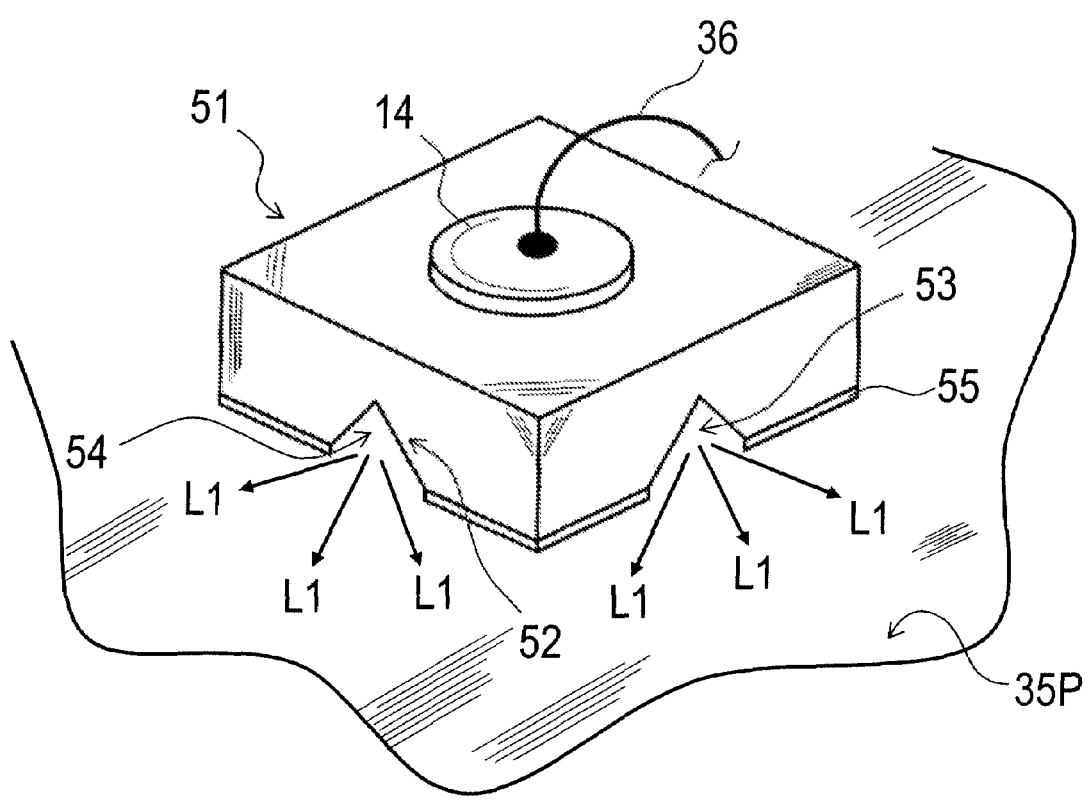
FIG. 9C is a schematic perspective view showing the semiconductor light emitting device mounted on the mounting surface of a packaging member.

FIG. 9C is a schematic perspective view showing the semiconductor light emitting device mounted on the mounting surface of a packaging member.

More specifically, the semiconductor light emitting device 51 of this embodiment is mounted on the mounting surface 35P such as the bottom of the reflecting cup of a lead frame, with the grooves 53, 54 of the semiconductor light emitting device 51 facing down. Light L1 emitted from the light emitting layer via the beveled surfaces 52 of the grooves 53, 54 toward the mounting surface 35P is repeatedly reflected between the mounting surface 35P and the beveled surfaces 52 and radiated outside from the end portions of the grooves 53, 54 as shown in the figure. That is, the grooves 53, 54 serve as waveguides for emitting the light L1 from the side faces.

Figure 9D:
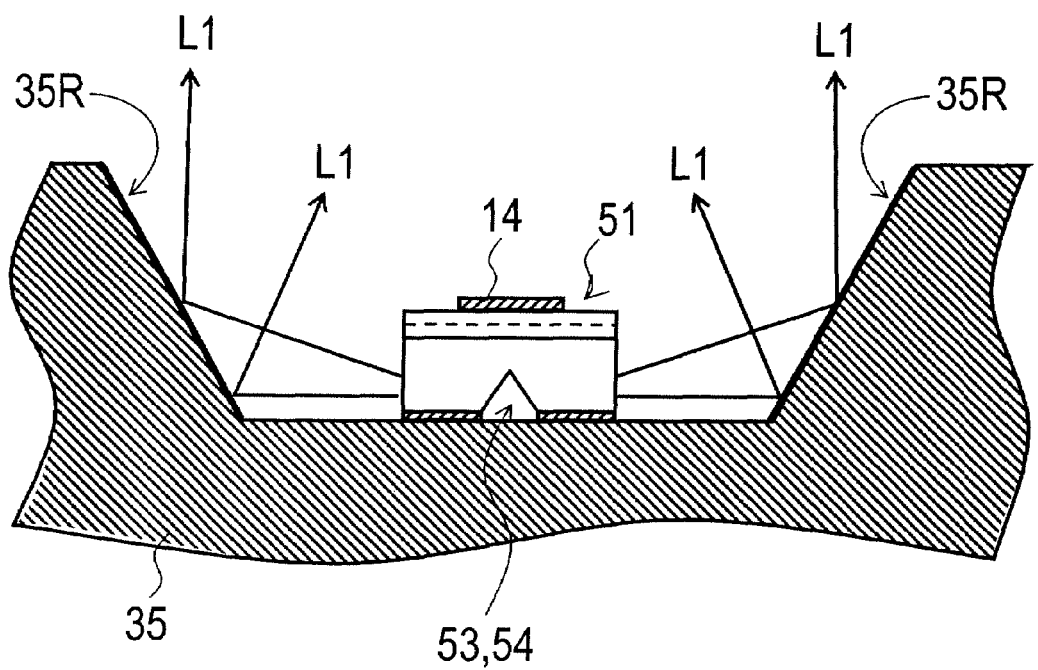
FIG. 9D is a side view showing that light L1 emitted from the end portions of grooves 53, 54 is reflected on the reflecting surface of the packaging member.

FIG. 9D is a side view showing that light L1 emitted from the end portions of grooves 53, 54 is reflected on the reflecting surface of the packaging member.

More specifically, the light L1 emitted from the end portions of grooves 53, 54 is reflected on the reflecting surface 35R such as the reflecting cup 35 of a lead frame, and extracted upward. As a result, the light extraction efficiency can be further enhanced.

Returning again to FIGS. 9A and 9B, the angle θ between the beveled surface 52 and the normal to the transparent substrate 12 is preferably selected to be in the vicinity of about 27 degrees (critical angle) when the transparent substrate 12 is made of GaP and molded with transparent resin composed of epoxy resin, because their refractive index for red light is 3.3 and 1.5, respectively. In general, a suitable angle is in the range of about 20 to 40 degrees.

In addition, as the area of the beveled surface 52 increases, the amount of light having an incident angle below the critical angle increases. It is thus desirable to increase the area as long as the mechanical strength of the LED 51 is not compromised.

Figure 9E:
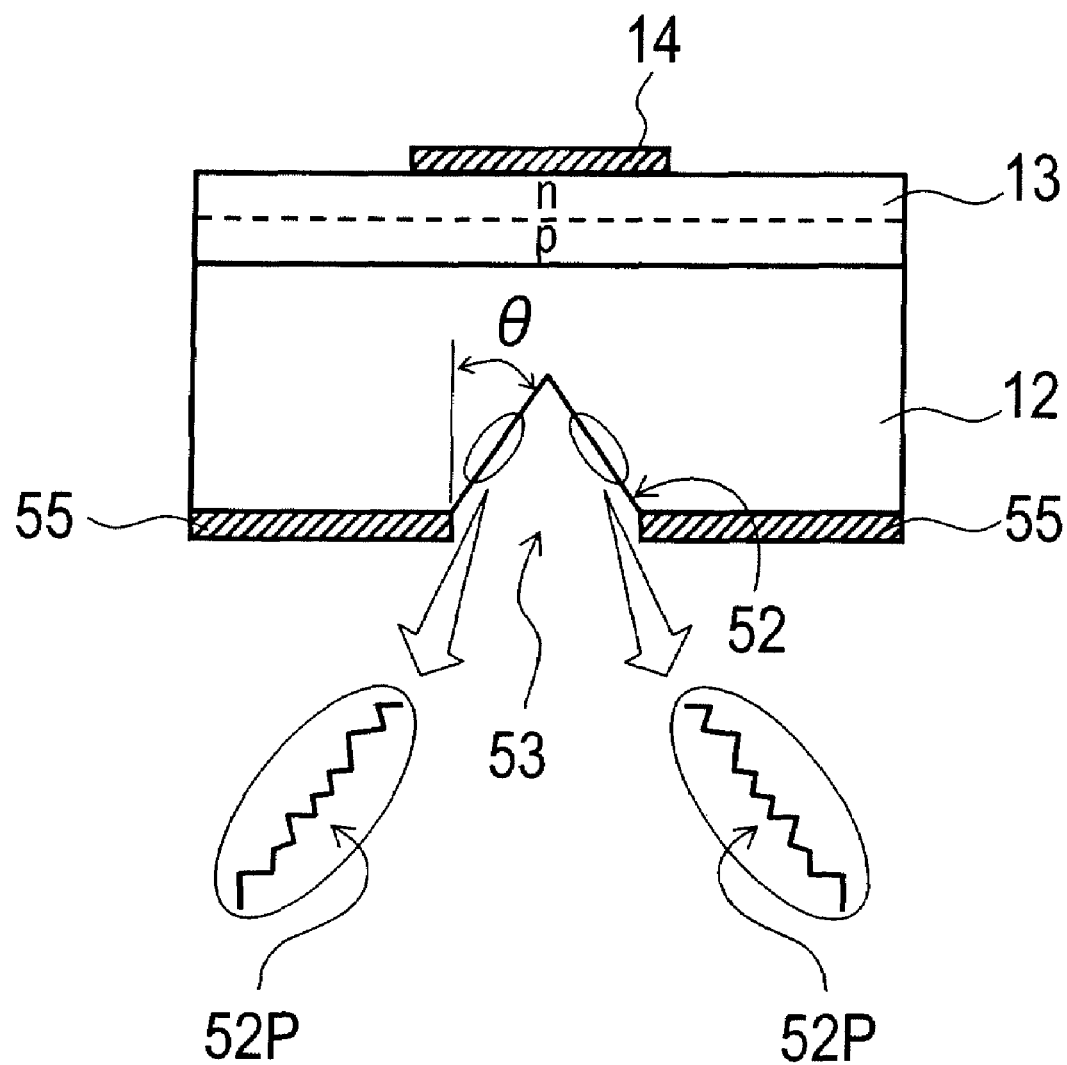
FIG. 9E is a cross section showing a semiconductor light emitting device having roughened regions 52P formed on the beveled surfaces 52.

Moreover, as shown in FIG. 9E, roughened regions 52P provided on the beveled surfaces 52 can further enhance the light extraction efficiency. More specifically, when the beveled surfaces 52 are provided thereon with roughened regions 52P made of irregularities similar to those described with reference to the first and second embodiments, the light extraction efficiency via the beveled surfaces 52 can be enhanced, and thus a stronger light L1 can be extracted from the end portions of the grooves 53, 54 served as waveguides.

A method of manufacturing the foregoing LED will now be described with reference to FIG. 10. FIG. 10 is a cross section illustrating a process of forming grooves 53, 54 having beveled surfaces 52 on a wafer having numerous LEDs formed thereon.

Figure 10A:
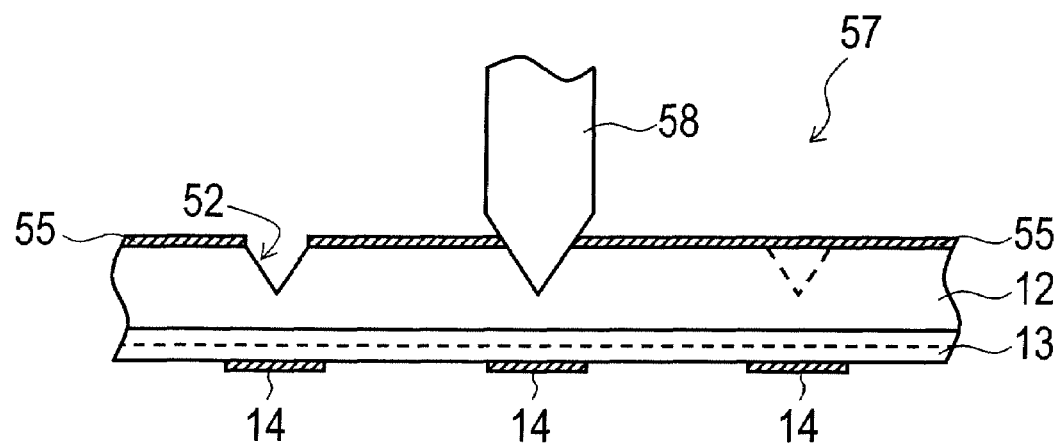
FIG. 10A is a cross section illustrating a process of forming grooves having beveled surfaces according to the third embodiment of the invention.

As shown in FIG. 10A, a wafer 57 having LEDs formed thereon is stuck to a dicing sheet (not shown) with second electrodes 55 of the wafer 57 facing up. A dicing blade 58 having a V-shaped cross section is used to half-dice the wafer 57 from the second electrode 55 side at a predetermined pitch.

Next, the wafer 57 is rotated by 90 degrees and half-diced in a direction orthogonal to the dicing grooves from the second electrode 55 side at a predetermined pitch.

Figure 10B:
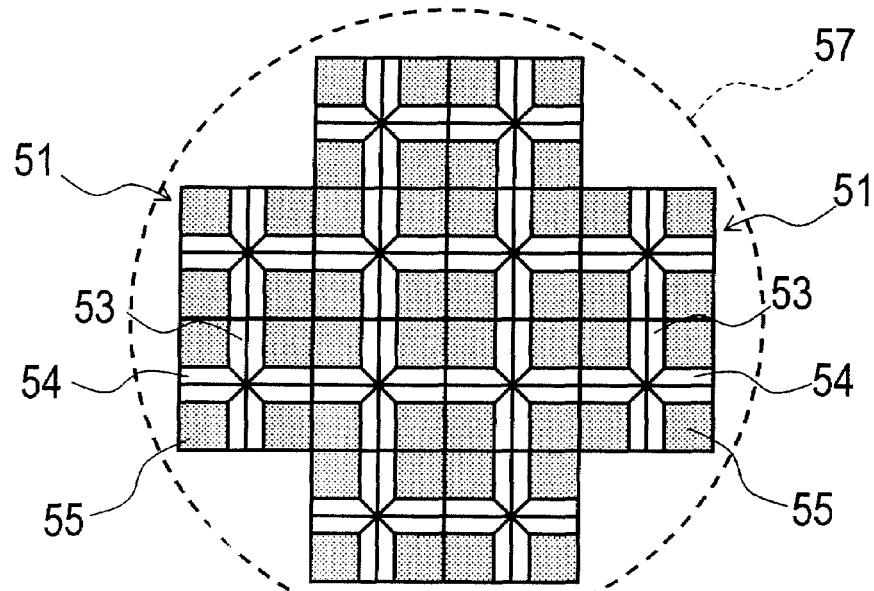
FIG. 10B is a plan view illustrating a process of forming grooves having beveled surfaces according to the third embodiment of the invention.

FIG. 10B is a bottom view showing part of the wafer 57 having arrays of V-shaped grooves that have been cut as described above.

Next, the half-diced V-shaped grooves 53, 54 are etched by, for example, mixture of hydrochloric acid and hydrogen peroxide solution, to remove any grinding damage layer due to dicing. The wafer 57 is then divided into chips to obtain the LED 51 shown in FIG. 9.

Subsequently, as in FIG. 7, the LED 51 is fixed to the reflecting cup 35 of a lead frame 34a using, for example, eutectic mounting with gold-tin alloy, to obtain a semiconductor light emitting apparatus.

As described above, according to this embodiment, light emitted from the light emitting layer toward the second major surface is extracted outside from the beveled surfaces 52 formed on the second major surface. This reduces the proportion of light subjected to multiple reflections on the second major surface and the upper surface of the light emitting layer 13 and absorbed by the light emitting layer 13, which results in a semiconductor light emitting device having sufficient optical output. Therefore a semiconductor light emitting apparatus having high optical output can be provided.

Moreover, the rectangular cross section of the transparent substrate 12 contributes to more uniform stress due to molded resin as compared to a LED having a trapezoidal cross section. This provides an advantage of preventing occurrence of failures such as chip lifting and cracking, and enhancing reliability. In addition, chip handling is facilitated.

The foregoing has described the case where the beveled surfaces 52 are diced and then etched. However, as illustrated in FIG. 9E, roughened regions 52P can be further formed on the beveled surfaces 52. The roughened regions 52P can be formed by the method described above with reference to the first or second embodiment.

Fourth Embodiment

Figure 11A:
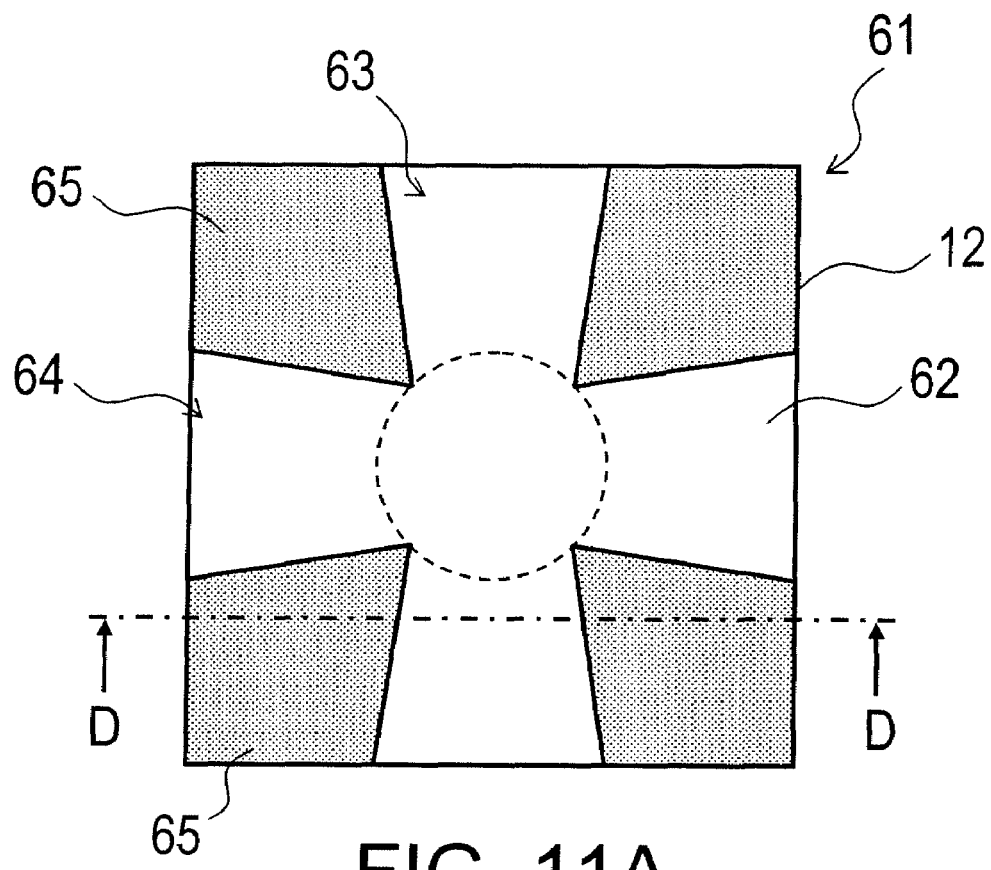
FIG. 11A is a bottom view thereof.
Figure 11B:
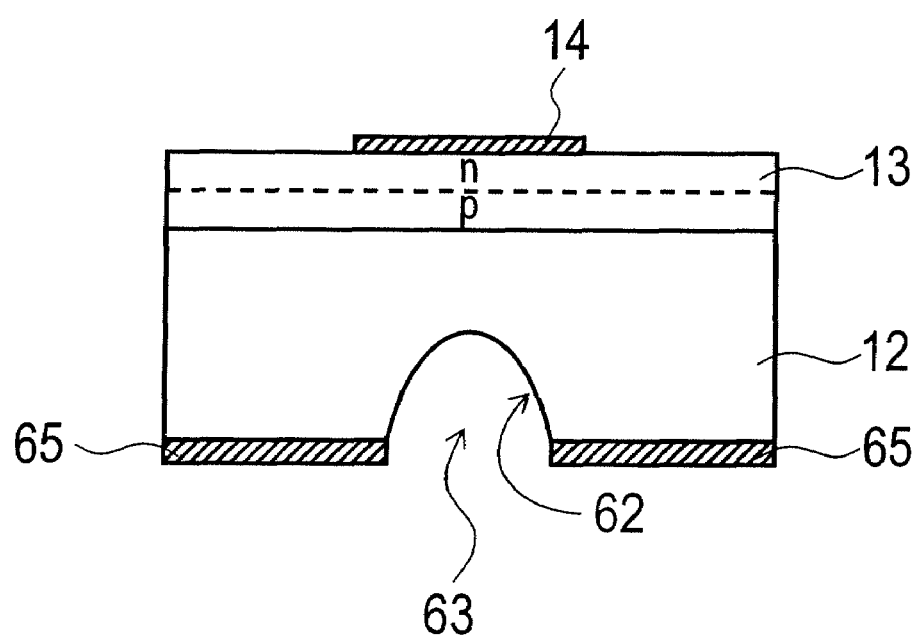
FIG. 11B is a cross section along line D-D in FIG. 11A.

FIGS. 11A and 11B show a semiconductor light emitting device according to a fourth embodiment of the invention. In particular, FIG. 11A is a bottom view thereof, and FIG. 11B is a cross section cut along line D-D in FIG. 11A and viewed in the direction of the arrows. In this embodiment, like components as in the first embodiment are marked with like reference numerals and will not be described further.

The fourth embodiment is different from the third embodiment in that grooves having a curved surface are formed on the second major surface of the transparent substrate, with the curved surface being opened from the first major surface side toward the second major surface side and being curved toward the first major surface side.

More specifically, as shown in FIGS. 11A and 11B, the LED 61 of this embodiment comprises grooves 63, 64 having a curved surface 62 and extending from one side to the other opposing side of the transparent substrate 12, where the grooves 63, 64 are provided on the second major surface of the transparent substrate 12, and the curved surface 62 is opened from the first major surface side toward the second major surface side and curved toward the first major surface side.

The grooves 63 and 64 intersect with each other at a generally right angle at the center of the transparent substrate 12, and have a groove width diverging from the center toward the side faces. Second electrodes 65 are formed on the remaining second major surface of the transparent substrate 12 where the grooves 63, 64 are not formed.

Light extracted from the curved surface 62 of the grooves 63, 64 having a groove width diverging from the center toward the side faces is repeatedly reflected on the bottom surface of the reflecting cup (not shown) and on the curved surface 62 as it travels toward the side face. Thus the grooves 63, 64 serve as waveguides as in the third embodiment, and can further increase the proportion of light extracted outside from the side faces.

The grooves 63, 64 having a curved surface and a diverging groove width can be formed by, for example, using a resist film as a mask and etching by mixture of hydrochloric acid and hydrogen peroxide solution.

As described above, the LED 61 includes grooves 63, 64 on the second major surface of the transparent substrate 12, with grooves 63, 64 having a groove width diverging from the center toward the side faces. As a result, the optical output extracted from the side faces can be further increased.

Figure 11C:
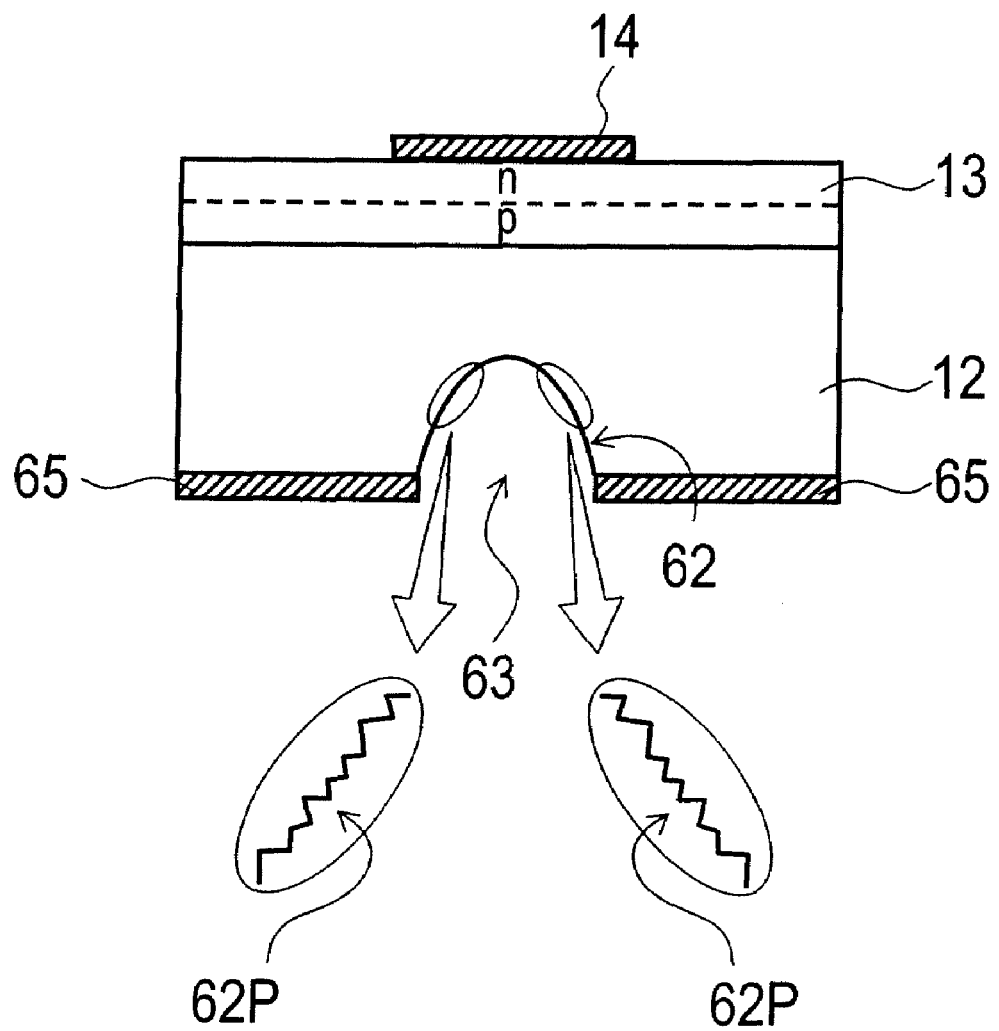
FIG. 11C is a cross section showing a semiconductor light emitting device having roughened regions 62P formed on the curved surfaces 62.

Moreover, as shown in FIG. 11C, roughened regions 62P provided on the curved surface 62 of the grooves 63, 64 can further enhance the light extraction efficiency. More specifically, when the curved surface 62 is provided thereon with roughened regions 62P as described with reference to the first and second embodiments, the light extraction efficiency via the curved surface 62 can be enhanced. As a result, the intensity of light extracted outside from the end portions of the grooves 63, 64 can be increased.

Fifth Embodiment

Figure 12A:
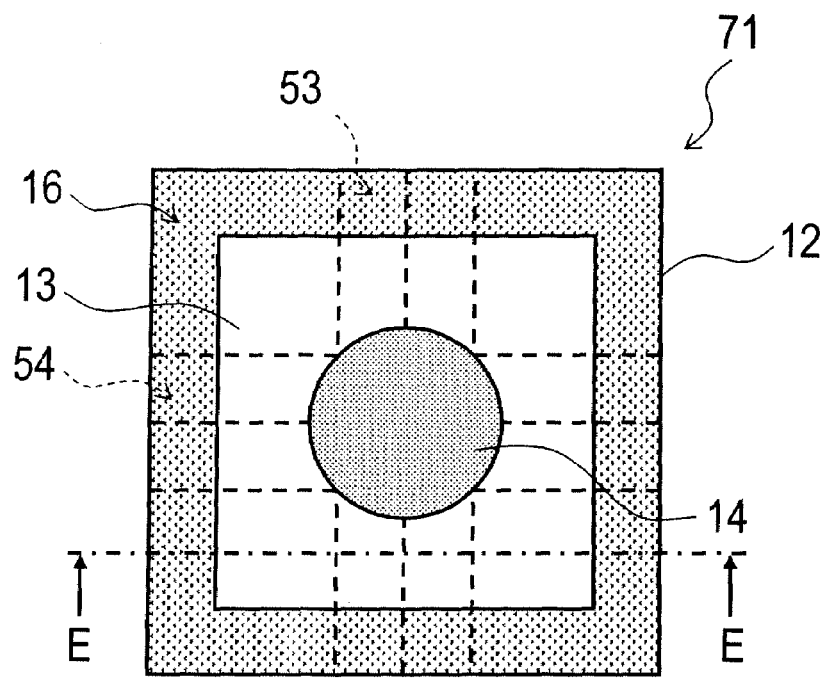
FIG. 12A is a plan view thereof.
Figure 12B:
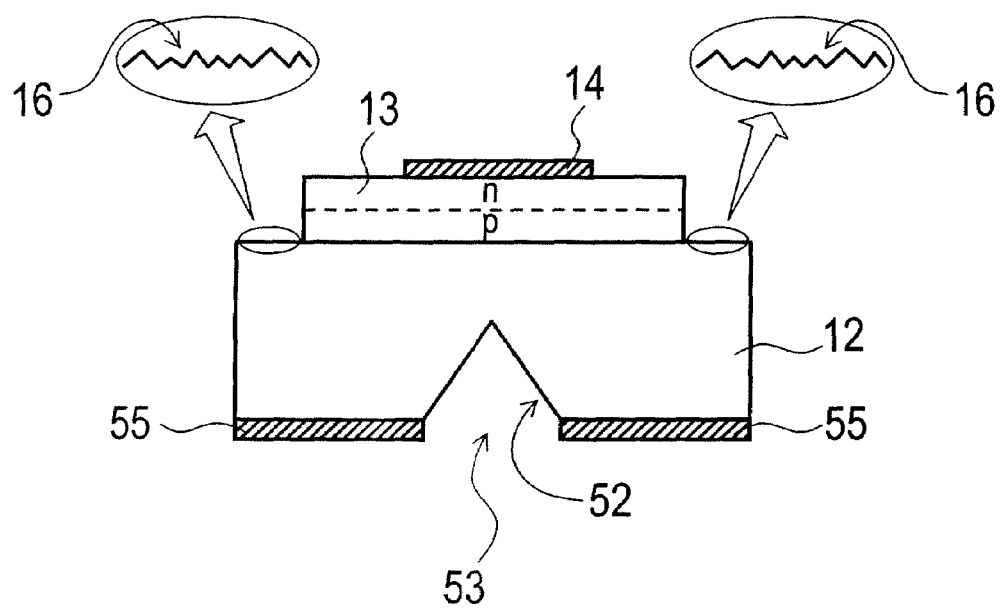
FIG. 12B is a cross section along line E-E in FIG. 12A.

FIG. 12 shows a semiconductor light emitting device according to a fifth embodiment of the invention. In particular, FIG. 12A is a plan view thereof, and FIG. 12B is a cross section cut along line E-E in FIG. 12A and viewed in the direction of the arrows. In this embodiment, like components as in the first embodiment are marked with like reference numerals and will not be described further.

The fifth embodiment is different from the third embodiment in including both a roughened region formed on the first major surface of the transparent substrate where the light emitting layer is not formed, and grooves having beveled surfaces on the second major surface diverging from the first major surface side toward the second major surface side.

More specifically, as shown in FIG. 12, the LED 71 of this embodiment comprises a transparent substrate 12 being translucent to the emission wavelength, a light emitting layer 13 having a p-n junction formed at the center of a first major surface of the transparent substrate 12, a first electrode 14 formed on the surface of the light emitting layer 13, and a roughened region 16 formed on the periphery of the first major surface surrounding the light emitting layer 13.

Moreover, the LED 71 comprises grooves 53, 54 formed on a second major surface opposing a first major surface of the transparent substrate 12 and extending from one side to the other opposing side of the transparent substrate 12. Each of the grooves 53, 54 has beveled surfaces 52 on the second major surface of the transparent substrate 12 diverging from the first major surface side toward the second major surface side. A second electrode 55 is formed on the part of the second major surface where the grooves 53, 54 are not formed. The grooves 53, 54 serve as waveguides as described above with reference to the third embodiment to enhance the light extraction efficiency.

As described above, according to this embodiment, light can be extracted from both the roughened region 16 and the grooves 53, 54, which enable to achieve a semiconductor light emitting device having higher optical output.

Figure 12C:
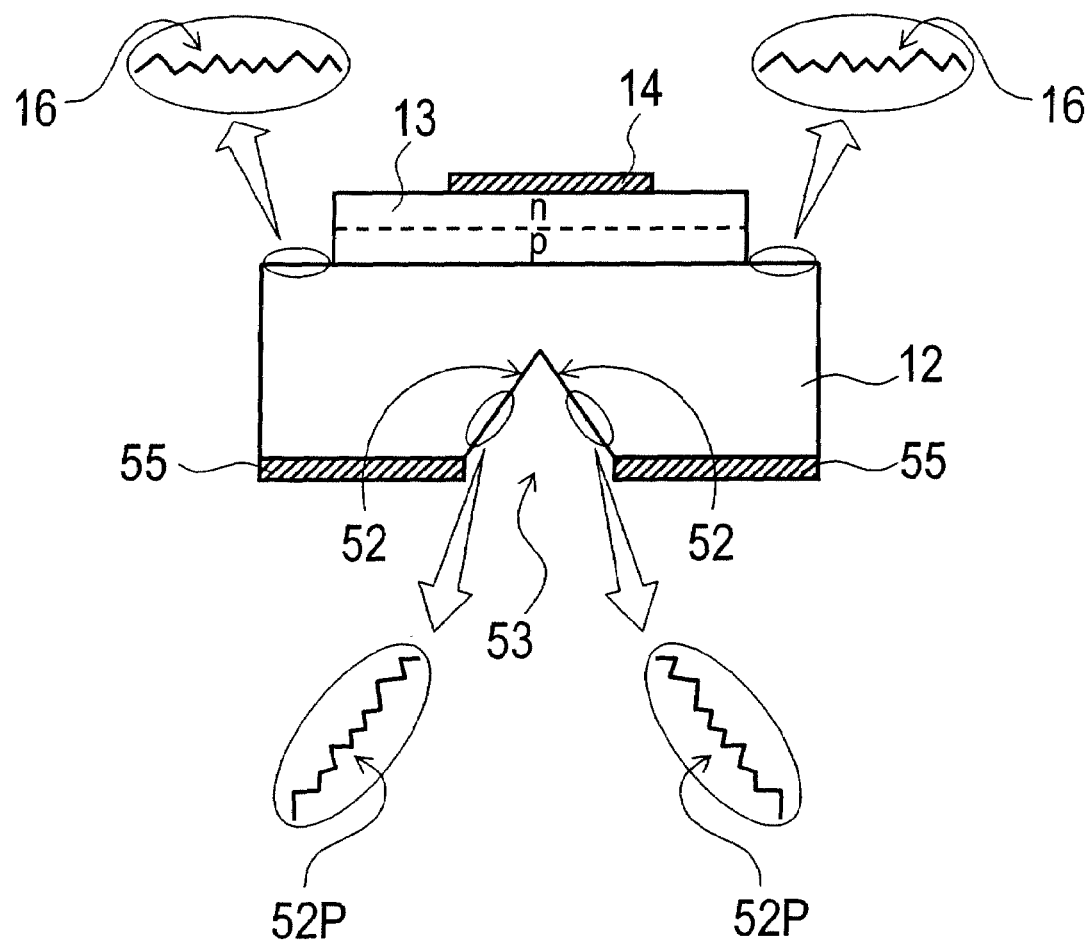
FIG. 12C is a cross section showing a semiconductor light emitting device having roughened regions 52P formed on the beveled surfaces 52.

As shown in FIG. 12C, also in this embodiment, roughened regions 52P provided on the beveled surfaces 52 of the grooves 53, 54 can further enhance the light extraction efficiency. That is, as described above with reference to the third embodiment, roughened regions 52P formed on the beveled surfaces 52 can enhance the efficiency of light extraction from the beveled surfaces 52. As a result, the intensity of light extracted outside from the end portions of the grooves 53, 54 can be increased.

The above embodiments are described with reference to a GaP transparent substrate and an InGaAlP light emitting layer. However, the invention is not limited thereto. Any substrate transparent to the emission wavelength may be used without particular limitation. For example, the invention is also applicable to a blue LED using a sapphire substrate and an infrared LED using a GaAs substrate.

Furthermore, it is to be understood that the roughened region may be formed on a portion of the surface of the light emitting layer where the first electrode is not formed, or on the side face of the transparent substrate.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

The invention claimed is:

1. A semiconductor light emitting device comprising:
   a transparent substrate having a first major surface and a second major surface, and being translucent to light in a first wavelength band;
   a light emitting layer selectively provided in a first portion on the first major surface of the transparent substrate and configured to emit light in the first wavelength band;
   a first electrode provided on the light emitting layer; and
   a roughened region provided in a second portion different from the first portion on the first major surface, wherein
   the first portion includes a center portion on the first major surface and a periphery portion distantly surrounding the center portion, part of the periphery portion being connected to the center portion,
   the second portion is a portion located between the center portion and the periphery portion,
   the light emitting layer being not provided in the second portion, and
   the first electrode is provided on both of the center portion and the periphery portion of the light emitting layer.

2. A semiconductor light emitting device according to claim 1, wherein irregularities constituting the roughened region have an average bottom length of 0.1 to 3 micrometers.

3. A semiconductor light emitting device according to claim 1, wherein irregularities constituting the roughened region have an average height of 0.05 to 1.5 micrometers.

4. A semiconductor light emitting device according to claim 1, wherein the first portion has an area of 0.6 to 0.9 times the area of the first major surface.

5. A semiconductor light emitting device according to claim 1, wherein
   the transparent substrate is made of GaP, and
   the light emitting layer is made of InGaAlP-based compound semiconductor.

6. A semiconductor light emitting device according to claim 1, wherein irregularities constituting the roughened region have an average bottom length of 0.5 to 2 micrometers.

7. A semiconductor light emitting device according to claim 1, wherein a part of the first electrode which is provided on the center portion of the light emitting layer and a part of the first electrode which is provided on the periphery portion of the light emitting layer are connected via wiring.

* * * * *